US009219456B1

(12) United States Patent
Ayrapetian et al.

(10) Patent No.: US 9,219,456 B1
(45) Date of Patent: Dec. 22, 2015

(54) CORRECTING CLOCK DRIFT VIA EMBEDDED SIN WAVES

(71) Applicant: Amazon Technologies, Inc., Reno, NV (US)

(72) Inventors: Robert Ayrapetian, Morgan Hill, CA (US); Yuwen Su, Cupertino, CA (US); Arnaud Jean-Louis Charton, Livermore, CA (US)

(73) Assignee: Amazon Technologies, Inc., Seattle, WA (US)

( * ) Notice: Subject to any disclaimer, the term of this patent is extended or adjusted under 35 U.S.C. 154(b) by 117 days.

(21) Appl. No.: 14/109,756

(22) Filed: Dec. 17, 2013

(51) Int. Cl.
| | |
|---|---|
| H03G 5/00 | (2006.01) |
| H04B 3/20 | (2006.01) |
| H03G 3/00 | (2006.01) |
| H04B 3/23 | (2006.01) |
| H04M 9/08 | (2006.01) |

(52) U.S. Cl.
CPC .. *H03G 3/00* (2013.01); *H04B 3/23* (2013.01); *H04M 9/082* (2013.01)

(58) Field of Classification Search
None
See application file for complete search history.

(56) References Cited

U.S. PATENT DOCUMENTS

| | | | | |
|---|---|---|---|---|
| 2009/0185695 | A1* | 7/2009 | Marton et al. | 381/66 |
| 2013/0044873 | A1* | 2/2013 | Etter | 379/406.12 |
| 2014/0112466 | A1* | 4/2014 | Bao et al. | 379/406.06 |

* cited by examiner

*Primary Examiner* — Andrew L Sniezek
(74) *Attorney, Agent, or Firm* — Knobbe, Martens, Olson & Bear, LLP

(57) ABSTRACT

Features are disclosed for measuring and correcting clock drift and propagation delay in an audio system through one or more waveforms embedded in an audio signal. A first device in communication with a speaker may be configured to obtain an audio signal and insert one or more waveforms into the audio signal. For example, the waveforms may be inserted during an interval of time. A second device in communication with a microphone may be configured to detect sound as an audio input signal. The second device may obtain a spectral representation of the audio input signal and determine a rotation based on the spectral representation at the frequency of at least one of the inserted waveforms. Clock drift may be determined based on the rotation.

20 Claims, 7 Drawing Sheets

CORRECTING CLOCK DRIFT VIA EMBEDDED SIN WAVES

BACKGROUND

Communication devices typically include a crystal oscillator to provide a clock signal for digital integrated circuits. The crystal oscillator may provide a clock signal at an approximately fixed fundamental frequency. For communication devices to transmit and receive information with one another, it is desirable to synchronize the clock signal between the transmitting and receiving devices. For example, the frequency of the clock signal between any two communication devices may be slightly different. When a clock of one communication device does not run at exactly the same speed compared to another clock, clock drift, or frequency offset, occurs. Clock drift may cause a mismatch between a number of samples generated by a transmitting device and a number of samples received by a receiving device.

Clock drift is often a problem in audio communication systems. For example, an audio communication system configured to obtain audio data of user utterances may include both a loudspeaker and a microphone. The loudspeaker may be used to play audio signals, including speech from a remote source during a telephone call, audio content presented from local storage or streamed from a network, as well as audio content from a video being watched. The audio signal played by the loudspeaker may be generated by an electronic device that includes a crystal oscillator providing a clock signal. In addition, the microphone may be used to capture audio signals from a local source, such as a user speaking voice commands or other utterances. For example, a user may speak a command to the microphone to control playback during a movie. The microphone may include a separate crystal oscillator providing a clock signal that is not exactly the same as the clock frequency of the crystal oscillator controlling the loudspeaker. As a result, during a given time interval, a number of audio samples played through the loudspeaker may not exactly match the number of audio samples received by the microphone during the same time interval. For example, frequency offset may cause nonlinear time-varying disturbances of the effective echo path, including from a D/A converter, a loudspeaker room microphone impulse response, and a A/D converter. The different sampling frequency in the microphone and loudspeaker path may cause a drift of the effective echo path, and therefore may cause jumps of the effective impulse response, which may deteriorate the performance of the adaptive filter.

Propagation delay is another problem in audio communication devices. Propagation delay results from a time delay between when a loudspeaker device sends an audio output signal to the loudspeaker for playback and when an audio input signal is received by a microphone device. When the microphone is in a constant position relative to the loudspeaker, the propagation delay remains constant. However, if the microphone is moved, the propagation delay may change.

The change in propagation delay can cause a mismatch between the number of audio samples played through the loudspeaker and the number of audio samples received by the microphone during a given time interval. Thus, clock drift and propagation delay are two problems in an audio communication system that can cause an offset in the number of audio samples received by a microphone compared to the number of samples played through a loudspeaker. In addition, if propagation delay becomes bigger than a delay path defined/allocated in the system to synchronize microphone output samples with a received reference signal, then the system may become non causal, and, as a result, the adaptive filter may diverge.

An audio communication system configured to obtain audio data of user utterances frequently performs acoustic echo cancellation to improve speech recognition. For example, an acoustic echo occurs when a signal emitted by the loudspeaker is captured by the microphone after undergoing reflections in the local environment. An acoustic echo canceller ("AEC") may be used to remove acoustic echo from an audio signal captured by a microphone in order to facilitate improved communication. For example, the AEC may filter the microphone signal by determining an estimate of the acoustic echo (e.g., the remote audio signal emitted from the loudspeaker and reflected in the local environment). The AEC can then subtract the estimate from the microphone signal to produce an approximation of the true local signal (e.g., the user's utterance). The estimate can be obtained by applying a transformation to a reference signal that corresponds to the remote signal emitted from the loudspeaker. In addition, the transformation can be implemented using an adaptive algorithm. For example, adaptive transformation relies on a feedback loop, which continuously adjusts a set of coefficients that are used to calculate the estimated echo from the far-end signal. Different environments produce different acoustic echoes from the same loudspeaker signal, and any change in the local environment may change the way that echoes are produced. By using a feedback loop to continuously adjust the coefficients, an AEC to can adapt its echo estimates to the local environment in which it operates.

The offset caused by clock drift and propagation delay can severely inhibit the effectiveness of the acoustic echo canceller. For example, if the offset is not corrected, speech recognition may be severely diminished. If the offset is great enough, speech recognition may not even be possible. Accordingly, there is a need to measure and correct clock drift and propagation delay in audio communication systems.

BRIEF DESCRIPTION OF DRAWINGS

Embodiments of various inventive features will now be described with reference to the following drawings. Throughout the drawings, reference numbers may be re-used to indicate correspondence between referenced elements. The drawings are provided to illustrate example embodiments described herein and are not intended to limit the scope of the disclosure.

DETAILED DESCRIPTION

Introduction

Generally described, the present disclosure relates to measuring and correcting clock drift and propagation delay in an audio communication system. This is accomplished through one or more waveforms embedded in an audio signal. For example, a first device in communication with a speaker may be configured to obtain an audio signal and insert one or more waveforms into the audio signal. For example, the waveforms may be inserted during an interval of time. A second device in communication with a microphone may be configured to detect sound as an audio input signal. The second device may obtain a spectral representation of the audio input signal and determine a rotation based on the spectral representation at the frequencies of the inserted one or more waveforms. Frequency offset may be determined based on the rotation that is indicative of a difference between a clock rate of the first device and a clock rate of a second device. In addition, the second device may determine a first angle of the spectral representation at the frequency of a first waveform and a second angle of the spectral representation at a frequency of the second waveform. The second device may determine a propagation delay based on the difference between the first and second angles.

Audio Communication System Environment

Figure 1:
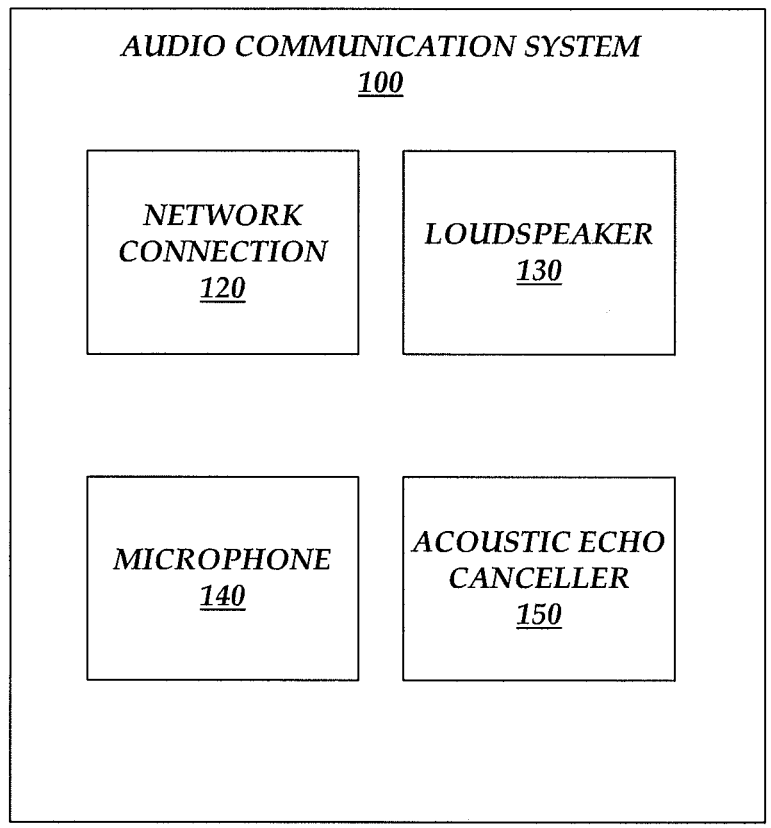
FIG. 1 is a block diagram illustrating some components of an audio communication system.

FIG. 1 shows an example of an audio communication system 100. Audio communication system 100 may be implemented in hardware and/or software using techniques known to persons of skill in the art. For example, communication system 100 may be implemented by a single telecommunication device, such as a mobile phone, or by a combination of several devices, including an entertainment system, a video game system, a mobile computing device, and a network-accessible server.

FIG. 1 shows components that may appear in an audio communication system 100, including a network connection 120, a loudspeaker 130, a microphone 140, and an acoustic echo canceller 150. Although shown as a single audio communication system 100, each of the network connection 120, loudspeaker 130, microphone 140, and acoustic echo canceller 150 may be distinct, physically-separate components that each include a crystal oscillator that provides a clock signal.

Network connection 120 may be used to send and receive communication signals over a network. The network may be any wired network, wireless network, or combination thereof. In addition, the network may be a personal area network, local area network, wide area network, cable network, satellite network, cellular telephone network, or combination thereof. For example, the network may be a publicly accessible network of linked networks, possibly operated by various distinct parties, such as the Internet. In some embodiments, the network may be a private or semi-private network, such as a corporate intranet. The network may include one or more wireless networks, such as a Wi-Fi network, a Global System for Mobile Communications (GSM) network, a Code Division Multiple Access (CDMA) network, a Long Term Evolution (LTE) network, or some other type of wireless network. Secured protocols such as Hypertext Transfer Protocol Secure (HTTPS) may be used to secure communications across the network, e.g., by encryption. Protocols and components for communicating via the Internet or any of the other aforementioned types of networks are well known to those skilled in the art of computer communications and thus, need not be described in more detail herein.

The communication signals that are sent and received by network connection 120 may include a far-end signal, which may be emitted from loudspeaker 130, and an AEC output signal, produced by acoustic echo canceller 150. For the sake of simplicity, microphone 140 is referred to herein as a single component. However, in some embodiments, multiple microphones may be used together and an AEC system (or portions of an AEC system) may be provided for each one.

Figure 2:
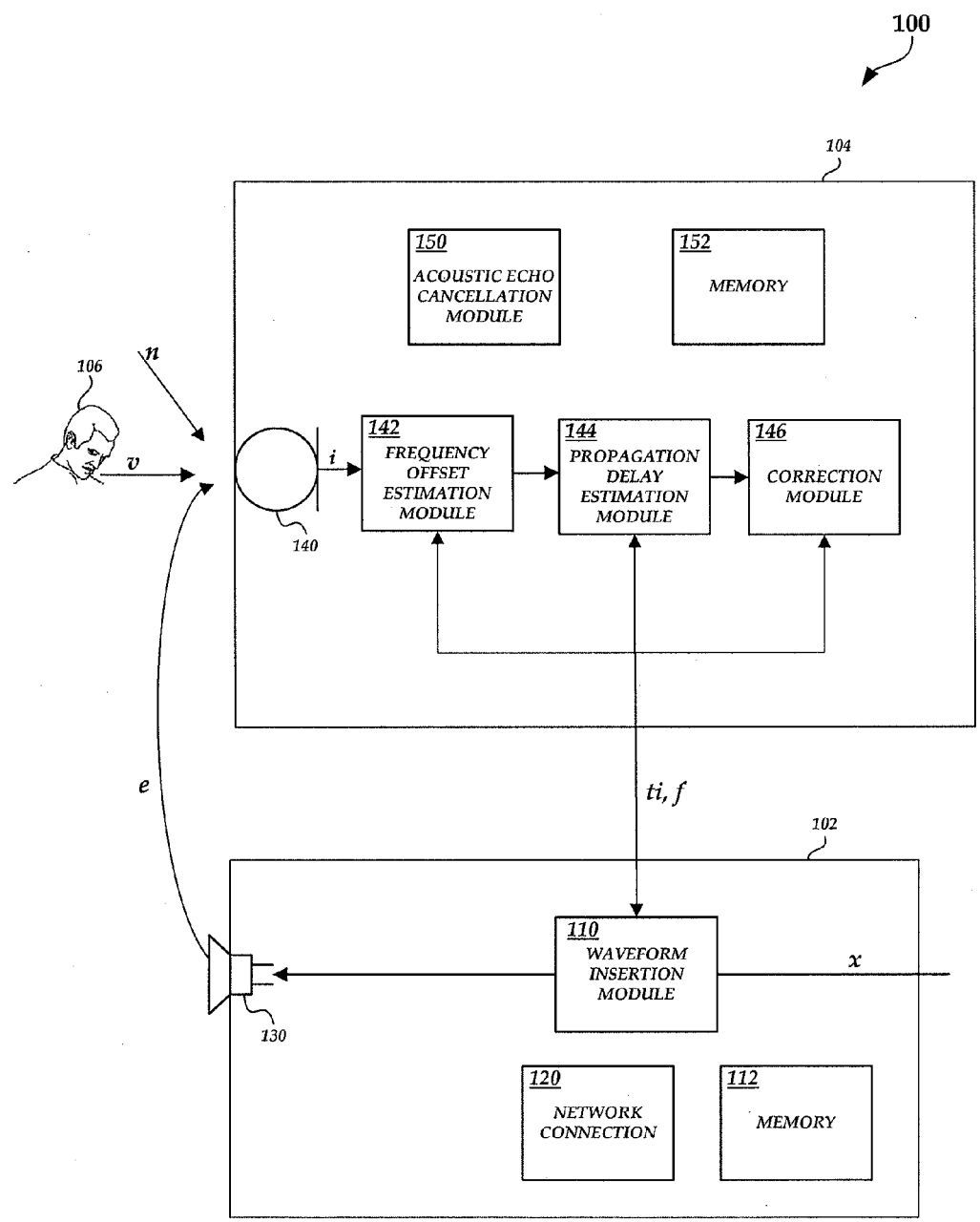
FIG. 2 is a block diagram of illustrative data flows and operations of an audio communication system according to an embodiment.

FIG. 2 illustrates an audio communication system 100 that includes a speaker device 102 and a microphone device 104 according to an embodiment. The speaker device 102 may comprise a waveform insertion module 110, a memory 112, a network connection 120, and a speaker 130. The speaker device 102 can correspond to a wide variety of electronic devices or some combination thereof. In some embodiments, the speaker device 102 may be a computing device that includes one or more processors and a memory 112 which may contain software applications executed by the processors. For example, the waveform insertion module 110 may be implemented by one or more processors running software applications executed by the processors. The speaker device 102 also includes a crystal oscillator that provides a clock signal to the one or more processors.

The microphone device 104 may comprise a microphone 140, a frequency offset estimation module 142, a propagation delay estimation module 144, and a correction module 146. In some embodiments, the microphone device 104 may also include an acoustic echo cancellation module 150 to cancel acoustic echoes in the audio signal obtained from the microphone 140. The microphone device 104 can correspond to a wide variety of electronic devices or some combination thereof. In some embodiments, the microphone device 104 may be a computing device that includes one or more processors and a memory 152 which may contain software applications executed by the processors. For example, the frequency offset estimation module 142, propagation delay estimation module 144, correction module 146, and acoustic echo cancellation module 150 may be implemented by one or more processors running software applications executed by the processors. The microphone device 104 also includes a crystal oscillator that provides a clock signal to the one or more processors. In some embodiments, the speaker device 102 and microphone device 104 may be included in the same device (e.g., a mobile phone), and different crystal oscillators in the device may provide different clock signals to the speaker device 102 and microphone device 104.

Additional hardware and/or software modules or components may be included in the audio communication system 100. For example, the microphone device 104 may include an automatic speech recognition ("ASR") module (not shown) for performing speech recognition on an audio signal that corresponds to a user utterance. The microphone device 104 may also include a network communication module (not shown) for establishing communications over communication networks, or directly with other computing devices.

Illustratively, the audio communication system 100 may be (or be part of) a personal computing device, laptop computing device, hand held computing device, terminal computing device, server computing device, mobile device (e.g., mobile phones or tablet computing devices), wearable device configured with network access and program execution capabilities (e.g., "smart eyewear" or "smart watches"), wireless device, electronic reader, media player, home entertainment system, gaming console, set-top box, television configured with network access and program execution capabilities (e.g., "smart TVs"), telephone, or some other electronic device or appliance.

In operation, the speaker device 102 obtains an audio signal x. The speaker device 102 may produce sound based on the audio signal x through playback on the speaker 130. The microphone device 104 may include a microphone 140 or other audio input component for accepting speech input. The audio input signal i detected by the microphone 110 may include components attributable to user 106's voice v, the background noise n, and the acoustic echo e. For example, the acoustic echo e may be generated when the speaker 130 reproduces audio signal x. Because different crystal oscillators provide a clock signal to the speaker device 102 and the microphone device 104, clock drift and propagation delay may cause an offset in the number of audio samples received in the audio input signal i in a given time interval compared to the number of audio samples generated in the audio output signal x during the same time interval.

The audio communication system 100 may measure and correct clock drift and propagation delay using the waveform insertion module 110 of the speaker device 102 working in combination with the frequency offset estimation module 142, propagation delay estimation module 144, and correction module 146 of the microphone device 104. For example, to measure clock drift, the waveform insertion module 110 of the speaker device 102 generally inserts at least one waveform into playback of an audio signal x, and the frequency offset estimation module 142 may determine clock drift based on the spectral properties of the detected waveform. In some embodiments, the waveform insertion module 110 and frequency offset estimation module 142 may perform the process described with respect to FIG. 3. To measure propagation delay, the waveform insertion module 110 of the speaker device 102 generally inserts at least two waveforms into playback of an audio signal x, and the propagation delay estimation module 144 may determine propagation delay based on the spectral properties of the detected at least two waveforms. In some embodiments, the waveform insertion module 110 and propagation delay estimation module 144 may perform the process described with respect to FIG. 4. To correct an offset caused by clock drift or propagation delay, generally the correction module 144 may add or drop samples of the audio input signal i or the audio output signal x based on the estimated offset. In some embodiments, the correction module may perform the process described with respect to FIG. 5.

In some embodiments, to measure frequency offset or clock drift, the waveform insertion module 110 first obtains an audio signal x. Next, the waveform insertion module 110 inserts a waveform at a frequency into the audio signal x during an interval of time to generate an audio output signal. The inserted waveform may be configured to be inaudible to a listener. For example, the waveform insertion module 110 may be configured to insert the waveform during a portion of the playback signal x that is above a sound threshold such that a listener would typically not perceive the sound attributable to the waveform.

In preferred embodiments, the waveform insertion module 110 inserts a sinusoidal waveform. The sinusoidal waveform may have a single discrete frequency. By selecting a sinusoidal waveform to be embedded in the playback signal, the microphone device 104 may be able to detect the embedded waveform using a Fast Fourier Transform (FFT) operation. In other embodiments, any other waveform, such as wavelets, may be used. However, using other waveforms may increase computational complexity needed to perform spectral analysis of the waveforms.

The waveform insertion module 110 may select any single frequency out of a broad range of frequencies for the waveform. For example, in some embodiments, the waveform may comprise any frequency between 1 kHz and 20 kHz, including 2 kHz, 5 kHz, 10 kHz, and 16 kHz. In addition, the waveform insertion module 110 may select a frequency for the embedded waveform based on frequencies present in the playback signal x. For example, depending on the frequencies present in the playback signal x, certain frequencies of an inserted waveform may be less likely to be audible to a listener than other frequencies. The waveform insertion module 110 may select a frequency for the inserted waveform that is less likely to be audible to a listener.

In some embodiments, the interval of time during which the waveform is inserted may vary. For example, the waveform preferably should be inserted into the playback signal x for a long enough duration so that it may be readily detected during frequency analysis by the microphone device 104. On the other hand, the waveform preferably should not be inserted into the playback signal x for so long that it becomes noticeable to a listener. In some embodiments, to balance between these objectives, the waveform insertion module 110 may insert each waveform for a duration as short as 0.5 s to as long as 4 s. In other embodiments, a shorter or longer duration may be used.

In some embodiments, the waveform insertion module 110 of the speaker device 102 may be configured to communicate to the microphone device 104 the interval of time ti and the frequency f of the inserted waveform. For example, the waveform insertion module 110 may communicate that it will insert a tone of 5 kHz beginning one second later and lasting for two seconds. By communicating the interval of time information, the microphone device 104 may be aware of when to expect the embedded tone in the audio input signal i that it receives. In addition, by communicating the frequency f of the inserted waveform, the microphone device 104 may be aware of which frequencies to analyze during spectral analysis of the received audio input signal i.

On the receiving end, the microphone 140 of the microphone device 104 may detect the sound produced by the speaker 130 as an audio input signal i. The frequency offset estimation module 142 may obtain the audio input signal i.

The frequency offset estimation module 142 may obtain a spectral representation of the audio input signal i. For example, the frequency offset estimation module 142 may obtain an FFT of the audio input signal i. In some embodiments, the frequency offset estimation module 142 is continuously determining the FFT of the audio input signal i. For example, the frequency offset estimation module 142 may determine the FFT of the audio input signal i every 128 samples. In other embodiments, the frequency offset estimation module 142 may determine when to determine the FFT of the audio input signal i based on information received from the waveform insertion module 110 indicating when the waveform will be embedded in the playback signal. Alternatively, the frequency offset estimation module 142 may determine the FFT of the audio input signal i at pre-determined times. For example, the frequency offset estimation module 142 may be configured to determine the FFT of the audio input signal i during startup of the system (e.g., during a greeting tone that is played during startup).

Next, the frequency offset estimation module 142 may determine a rotation based on the spectral representation at the frequency of the inserted waveform. For example, if the frequency offset estimation module 142 is expecting an embedded sinusoidal waveform of 5 kHz, the frequency offset estimation module 142 may determine a rotation at a frequency corresponding to 5 kHz. In particular, the spectral representation may correspond to a representation of the audio input signal i in the frequency domain, such as an FFT. In the frequency domain, the response of a tone may correspond to a complex vector. The FFT may be determined for each frame of the audio input signal (e.g., for every 128 samples of the audio input signal). The complex vector corresponding to a particular frequency may rotate between the FFT of one frame and the FFT of a previous frame. (R.A)

In some embodiments, the frequency offset estimation module 142 may determine a frequency offset based on the rotation that is indicative of a difference between a clock rate of the speaker device and a clock rate of the microphone device. For example, frequency offset is typically measured in units of parts per million (PPM), which is a relative form of measurement. If a crystal oscillator in the speaker device 102 provides a clock signal at a frequency of 48,000 Hz, and a crystal oscillator in the microphone device 104 provides a clock signal at a frequency of 48,001 Hz, the frequency offset between the speaker device 102 and the microphone device 104 would be 1 Hz, or approximately 21 PPM.

To determine the frequency offset, the frequency offset estimation module 142 may utilize a relationship between the rotation of the FFT at the frequency of the inserted waveform, the frequency of the inserted waveform, and the frequency offset. In particular, the frequency offset estimation module 142 may continuously determine the FFT of the audio input signal i during the interval of time in which the embedded waveform is present. For example, if the microphone device 104 samples the audio input signal i at a sampling frequency of 16 kHz, and the frequency offset estimation module 142 is configured to determine the FFT of the audio input signal i every 128 samples, then in an interval of one second, the frequency offset estimation module 142 may determine 125 FFTs (e.g., there are 125 sets of 128 samples in one second of an audio input signal i sampled at 16 kHz).

Figure 6A:
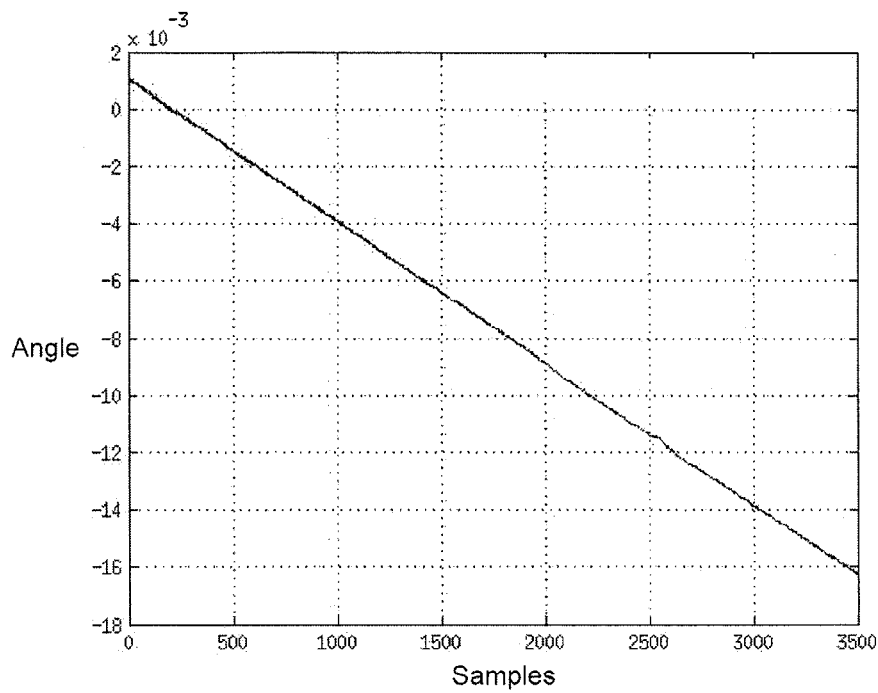
FIG. 6A is a diagram illustrating an example of rotation in the frequency of an embedded waveform.
Figure 6B:
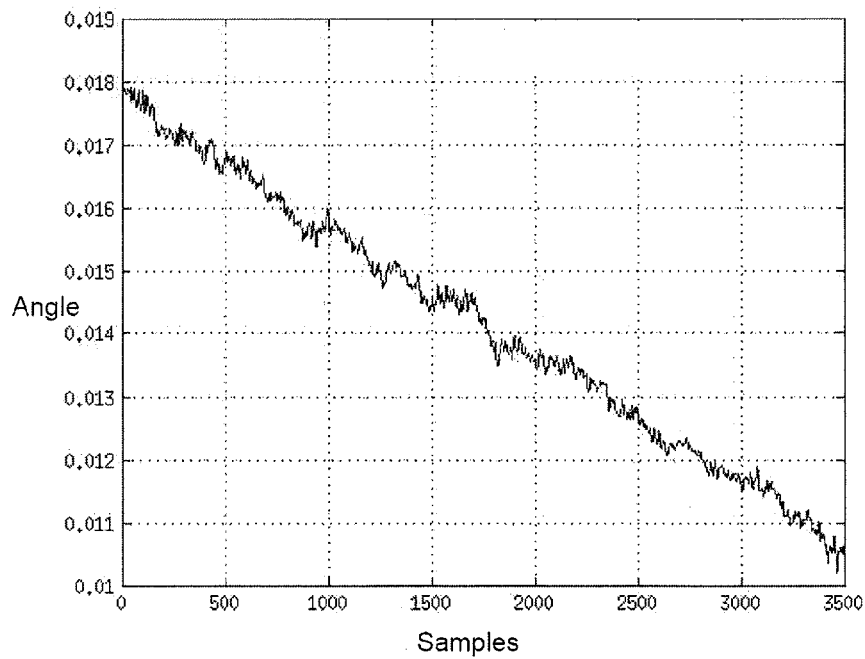
FIG. 6B is a diagram illustrating another example of rotation in the frequency of an embedded waveform.

If there is no clock drift, or frequency offset, then the vector corresponding to the embedded waveform in the FFT determined by the frequency offset estimation module 142 will be constant. For example, if there is no clock drift, with each successive FFT determined by the frequency offset estimation module 142, the angle of the vector of the FFT at the frequency of the inserted waveform will be constant. However, if there is a frequency offset, then the angle of the vector of the FFT at the frequency of the inserted waveform will change, or rotate. For example, the angle of the vector of the FFT at the frequency of the inserted waveform will rotate in time, as illustrated in FIGS. 6A and 6B. In particular, the rotation is proportional to the frequency of the inserted waveform multiplied by the frequency offset. The frequency offset estimation module 142 is aware of the frequency of the inserted waveform, and it measures the rotation of the FFT at the frequency of the inserted waveform. Accordingly, the frequency offset estimation module 142 may determine the frequency offset based on the frequency of the inserted waveform and the rotation of the FFT at the frequency of the inserted waveform.

In some embodiments, to measure propagation delay, the waveform insertion module 110 first obtains an audio signal x. Next, the waveform insertion module 110 inserts at least two waveforms at different frequencies into the audio signal x during an interval of time to generate an audio output signal. For example, to measure propagation delay, the waveform insertion module 110 may insert a first waveform at a first frequency as described above with respect to measurement of frequency offset. In addition, the waveform insertion module 110 may insert a second waveform at a second frequency using the same technique. In one embodiment, a first waveform is selected at a first frequency of 2 kHz, and a second waveform is selected at a second frequency of 2.125 kHz. For example, if based on a fundamental frequency of 125 Hz, 2 kHz corresponds to the 16th tone (e.g., 16*125 Hz=2,000 Hz) and 2.125 kHz corresponds to the 17th tone (e.g., 17*125 Hz=2,125 Hz).

On the receiving end, the microphone 140 of the microphone device 104 may detect the sound produced by the speaker 130 as an audio input signal i. The propagation delay estimation module 144 may obtain the audio input signal i.

The propagation delay estimation module 144 may obtain a spectral representation of the audio input signal i. For example, the propagation delay estimation module 144 may obtain an FFT of the audio input signal i. In some embodiments, the propagation delay estimation module 144 is continuously determining the FFT of the audio input signal i. In other embodiments, the frequency offset estimation module 142 may determine when to determine the FFT of the audio input signal i based on information received from the waveform insertion module 110 indicating when the waveforms will be embedded in the playback signal.

Next, the propagation delay estimation module 144 may determine the angles of the spectral representation at the first and second frequencies of the first and second inserted waveforms. For example, if the propagation delay estimation module 144 is expecting an embedded sinusoidal waveforms of 2 kHz and 2.125 kHz, the propagation delay estimation module 144 may determine the angle of the vector of the FFT corresponding to the waveform at the frequency of 2 kHz and the angle of the vector of the FFT corresponding to the waveform at the frequency of 2.125 kHz.

In some embodiments, the propagation delay estimation module 144 may determine a propagation delay based on the determined angles of the spectral representation of the audio input signal i at the first and second frequencies of the first and second inserted waveforms. In particular, the difference in the determined angles of the FFT at the first and second frequencies is proportional to the difference in the first and second frequencies multiplied by the propagation delay. The propagation delay estimation module 144 is aware of the first and second frequencies of the inserted waveforms, and it measures the difference in the angles of the FFT at the first and second frequencies of the inserted waveform. Accordingly, the propagation delay estimation module 144 may determine the propagation delay based a difference between the determined first and second angles.

In some embodiments, the correction module 146 may be configured to correct for the offset determined by either of the frequency offset estimation module 142 or the propagation delay estimation module 144. For example, depending on the determined offset, and whether the offset is positive or negative, the correction module 146 may be configured to add or drop a number of samples based on the frequency offset that is indicative of a difference between the clock rate of the speaker device and the clock rate of the microphone device. The correction module 146 may correct frequency offset continuously as the audio input signal i is received. For example, if the determined frequency offset corresponds to 21 PPM, the correction module 146 may add or drop one sample out of every 48,000 samples.

The correction module 146 may be configured to correct for the offset determined by the propagation delay estimation module 144. For example, as samples of the audio input signal i are received, the samples may be stored in a buffer. To correct propagation delay, the correction module 146 may shift a position in the buffer. For example, if the propagation delay is determined to be 1,000 samples, a position in the buffer can be shifted by 1,000 samples. In some embodiments, propagation delay estimation and correction is performed during startup. For example, if the microphone device 104 is stationary relative to the speaker device 102, the propagation delay will not change. In some embodiments, propagation delay estimation may be performed again based on a detected movement of the microphone device 104. In addition, propagation delay estimation may be performed at future pre-set intervals in order to correct propagation delay introduce by any other movement.

Process for Frequency Offset Estimation

Figure 3:
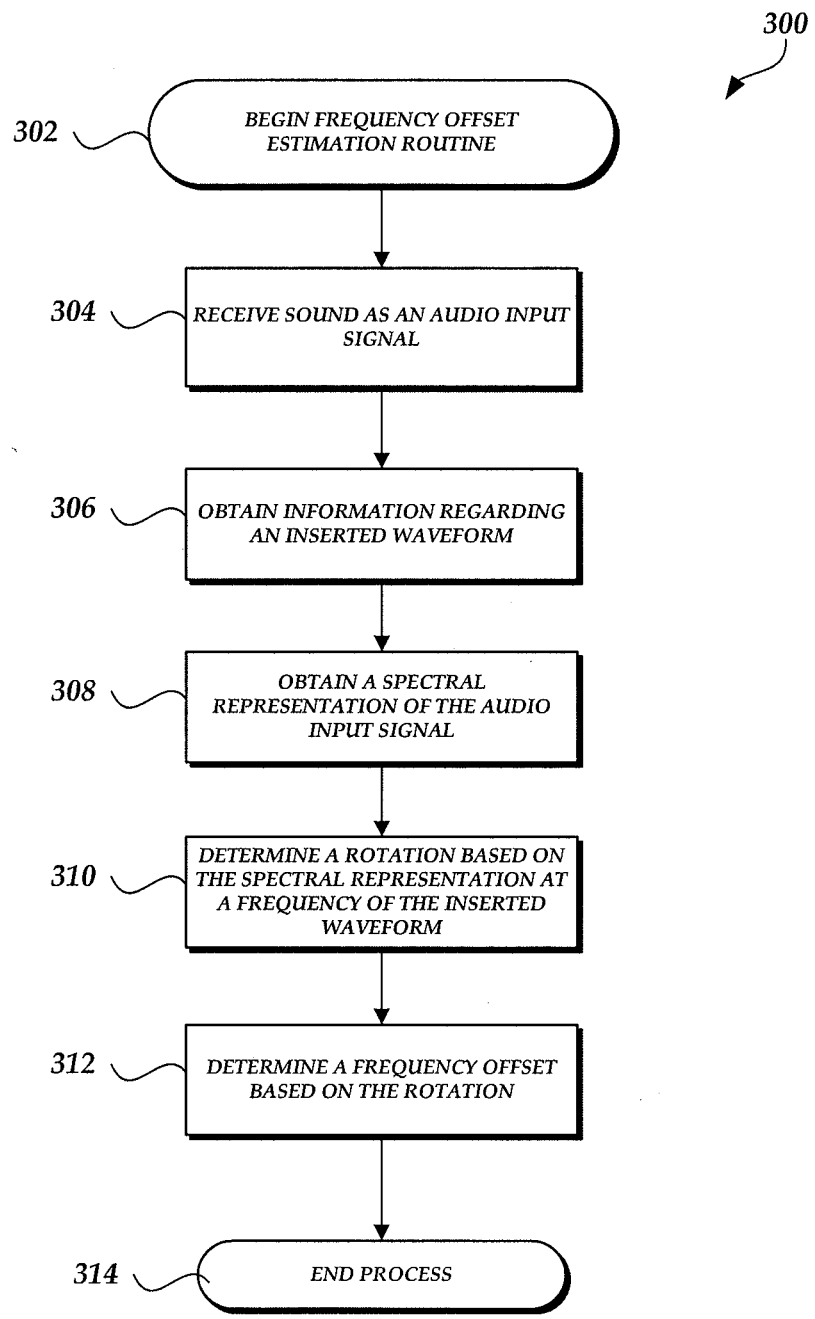
FIG. 3 is a flow diagram of an illustrative process for performing frequency offset estimation according to an embodiment.

With reference now to FIG. 3, an example process 300 for estimating frequency offset according to an embodiment will be described. The process 300 begins at block 302. The process 300 may be embodied in hardware, a set of executable program instructions, or a combination of hardware and executable program instructions. The process 300 may be performed, for example, by the frequency offset estimation module 142 of the microphone device 104 of FIG. 2. Although the process 300 of FIG. 3 will be described with respect to the components of FIG. 2, the process 300 is not limited to implementation by, or in conjunction with, any specific component shown in FIG. 2. In some embodiments, the process 300, or some variant thereof, may be implemented by alternative components, by the components of FIG. 2 in a different configuration, etc.

At block 304, the frequency offset estimation module 142 receives sound as an audio input signal. At block 306, the frequency offset estimation module 142 obtains information regarding an inserted waveform.

At block 308, the frequency offset estimation module 142 obtains a spectral representation of the audio input signal. For example, the frequency offset estimation module 142 may be configured to determine the FFT of the audio input signal.

At block 310, the frequency offset estimation module 142 may determine a rotation based on the spectral representation at a frequency of the inserted waveform. For example, in some embodiments, the frequency offset estimation module 142 may determine the rotation of the vector corresponding to the inserted waveform in the FFT at a frequency of the inserted waveform.

At block 312, the frequency offset estimation module 142 may determine a frequency offset based on the rotation that is indicative of a difference between the clock rate of the speaker device and the clock rate of the microphone device. For example, frequency offset estimation module 142 may determine a frequency offset based on the rotation and the frequency of the inserted waveform. After the frequency offset has been determined, the process 300 ends at block 314.

Figure 4:
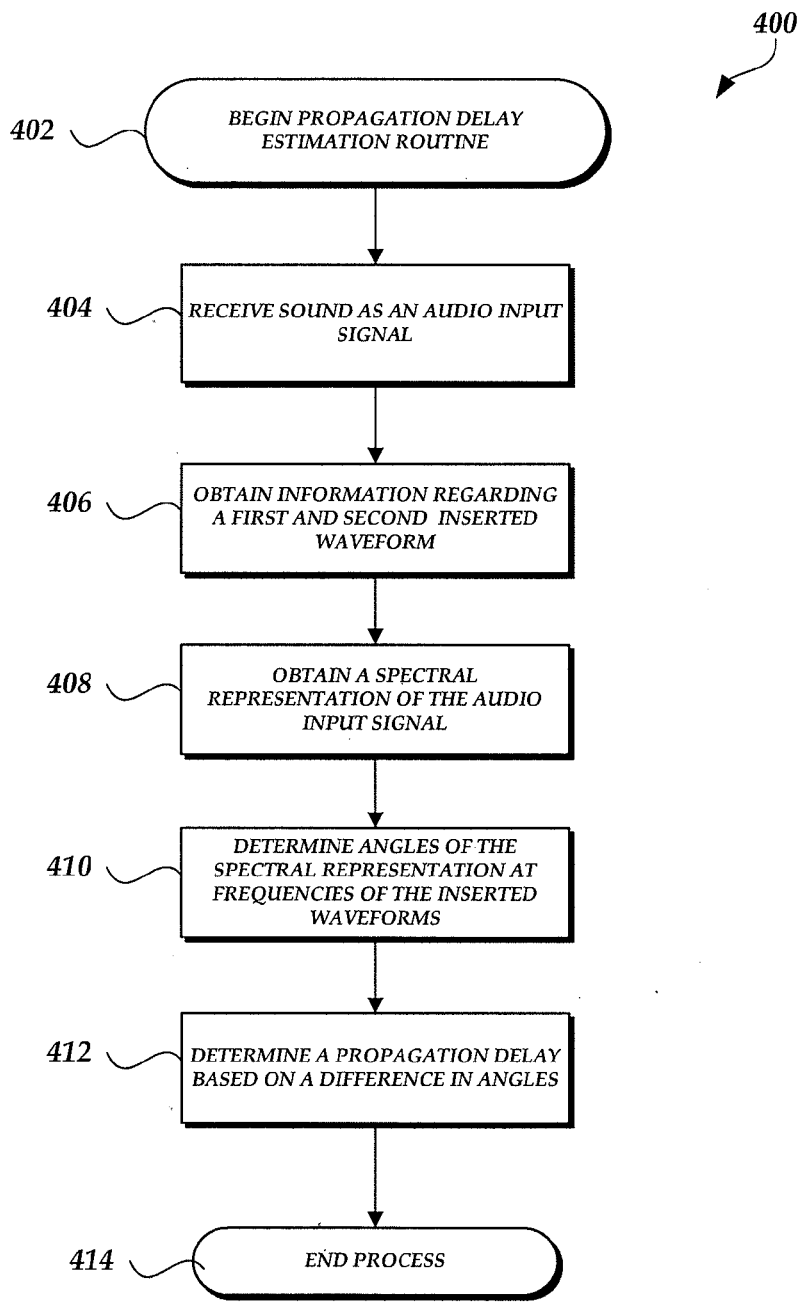
FIG. 4 is a flow diagram of an illustrative process for performing propagation delay estimation according to an embodiment.

Turning now to FIG. 4, an example process 400 for estimating propagation delay according to an embodiment will be described. The process 400 begins at block 402. The process 400 may be embodied in hardware, a set of executable program instructions, or a combination of hardware and executable program instructions. The process 400 may be performed, for example, by the propagation delay estimation module 144 of the microphone device 104 of FIG. 2. Although the process 400 of FIG. 4 will be described with respect to the components of FIG. 2, the process 400 is not limited to implementation by, or in conjunction with, any specific component shown in FIG. 2. In some embodiments, the process 400, or some variant thereof, may be implemented by alternative components, by the components of FIG. 2 in a different configuration, etc.

At block 404, the propagation delay estimation module 144 receives sound as an audio input signal. At block 406, the propagation delay estimation module 144 obtains information regarding first and second inserted waveforms.

At block 408, the propagation delay estimation module 144 obtains a spectral representation of the audio input signal. For example, the propagation delay estimation module 144 may be configured to determine the FFT of the audio input signal.

At block 410, propagation delay estimation module 144 may determine angles of the spectral representation at the frequencies of the inserted waveforms. For example, in some embodiments, the propagation delay estimation module 144 may determine a first angle of the FFT at a frequency of the first inserted waveform and determine a second angle of the FFT at a frequency of the second inserted waveform.

At block 412, the propagation delay estimation module 144 may determine a propagation delay based on the determined angles. For example, the propagation delay estimation module 144 may determine a propagation delay between an audio input signal and an audio output signal based on the difference between the first and second angles. After the propagation delay has been determined, the process 400 ends at block 414.

Figure 5:
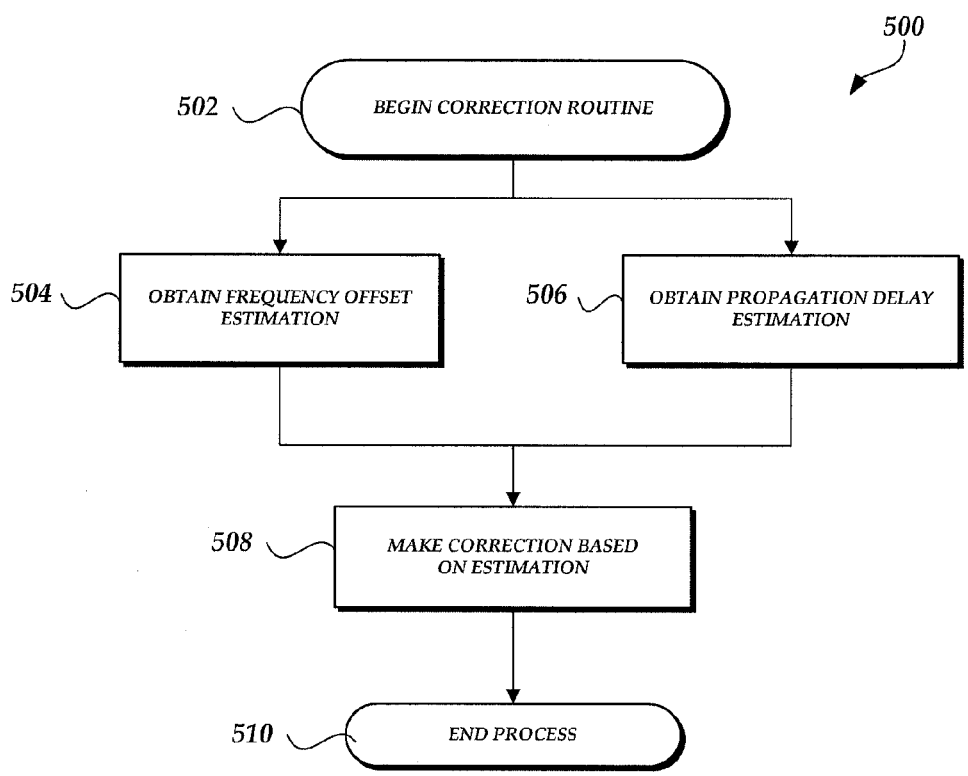
FIG. 5 is a flow diagram of an illustrative process for correcting frequency offset and propagation delay according to an embodiment.

Turning now to FIG. 5, an example process 500 for correcting offset according to an embodiment will be described. The process 500 begins at block 502. The process 500 may be embodied in hardware, a set of executable program instructions, or a combination of hardware and executable program instructions. The process 500 may be performed, for example, by the correction module 146 of the microphone device 104 of FIG. 2. Although the process 500 of FIG. 5 will be described with respect to the components of FIG. 2, the process 500 is not limited to implementation by, or in conjunction with, any specific component shown in FIG. 2. In some embodiments, the process 500, or some variant thereof, may be implemented by alternative components, by the components of FIG. 2 in a different configuration, etc.

At block 504, the correction module 146 obtains an estimate of frequency offset from the frequency offset estimation module 142. At block 506, the correction module 146 obtains an estimate of propagation delay from the propagation delay estimation module 144.

At block 508, the correction module 146 may make a correction based on the estimated frequency offset or propagation delay. For example, depending on whether the offset is positive or negative, the correction module 146 may add or drop samples from either the input audio signal i or the output audio signal x. If the frequency offset is determined to be 21 PPM, for example, the correction module 146 may add or drop one out of 48,000 samples from the input audio signal i. If the propagation delay is determined to be 1,000 samples, for example, the correction module 146 may perform a single shift of a position in an input buffer by 1,000 samples. After the offset has been corrected, the process 500 ends at block 510.

Noise PSD Examples

FIG. 6A is a diagram illustrating an example of rotation in the frequency of an embedded waveform. The horizontal axis indicates number of samples received in the input audio signal i. As such, the horizontal axis indicates the passage of time. The vertical axis indicates the angle of the FFT at the frequency of the inserted waveform. In the example of FIG. 6A, the embedded waveform has a frequency of 2 kHz. Based on the rate of rotation of the angle of the FFT at the frequency of the inserted waveform, the diagram of FIG. 6A illustrates a frequency offset of 5 PPM.

FIG. 6B is a diagram illustrating another example of rotation in the frequency of an embedded waveform. The horizontal axis indicates number of samples received in the input audio signal i. The vertical axis indicates the angle of the FFT at the frequency of the inserted waveform. In the example of FIG. 6B, like FIG. 6A, the embedded waveform has a frequency of 2 kHz. However, FIG. 6B illustrates a slower rate of rotation. Based on the rate of rotation of the angle of the FFT at the frequency of the inserted waveform, the diagram of FIG. 6B illustrates a frequency offset of 2 PPM.

Figure 7:
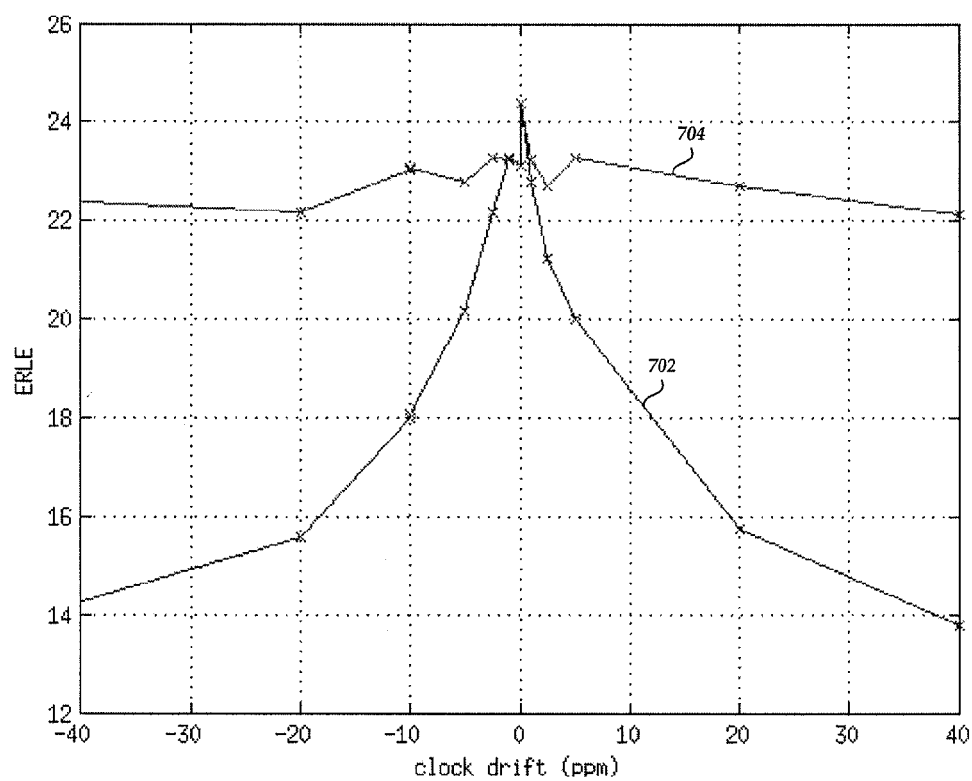
FIG. 7 is a diagram illustrating an example comparing a difference in degradation of acoustic echo cancellation performance as offset increases based on whether offset correction is performed.

FIG. 7 is a diagram illustrating an example showing degradation of acoustic echo cancellation performance as offset increases when offset correction is not performed compared to when offset correction is performed. The horizontal axis indicates clock drift offset measured in PPM. The vertical axis indicates level of echo suppression provided by an AEC, measured in dB. Plot 702 illustrates degradation of acoustic echo cancellation performance as offset increases when offset correction is not performed. Without any frequency offset, the AEC may provide approximately 24 dB suppression of echo. At 10 PPM frequency offset, the level of echo suppression provided by the AEC has dropped to approximately 18.5 dB. At 40 PPM frequency offset, the level of echo suppression provided by the AEC has dropped to just 14 dB. At this level, it may be more difficult to perform speech recognition.

Plot 704 illustrates the lack of degradation of acoustic echo cancellation performance as offset increases when offset correction is performed. Without any frequency offset, the AEC may provide approximately 26 dB suppression of echo. At 10 PPM frequency offset, with offset correction, the level of echo suppression provided by the AEC has only dropped to approximately 23 dB. At 40 PPM frequency offset, the level of echo suppression provided by the AEC has only dropped to approximately 22 dB. Accordingly, by measuring and correcting for frequency offset and propagation delay, an audio communication system may continue to perform high-quality echo cancellation even when there is substantial frequency offset and propagation delay in a system.

TERMINOLOGY

Depending on the embodiment, certain acts, events, or functions of any of the processes or algorithms described herein can be performed in a different sequence, can be added, merged, or left out altogether (e.g., not all described operations or events are necessary for the practice of the algorithm). Moreover, in certain embodiments, operations or events can be performed concurrently, e.g., through multi-threaded processing, interrupt processing, or multiple processors or processor cores or on other parallel architectures, rather than sequentially.

The various illustrative logical blocks, modules, routines and algorithm steps described in connection with the embodiments disclosed herein can be implemented as electronic hardware, computer software, or combinations of both. To clearly illustrate this interchangeability of hardware and software, various illustrative components, blocks, modules and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The steps of a method, process, routine, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of a non-transitory computer-readable storage medium. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is to be understood with the context as used in general to convey that an item, term, etc. may be either X, Y or Z, or a combination thereof. Thus, such conjunctive language is not generally intended to imply that certain embodiments require at least one of X, at least one of Y and at least one of Z to each be present.

While the above detailed description has shown, described and pointed out novel features as applied to various embodiments, it can be understood that various omissions, substitutions and changes in the form and details of the devices or algorithms illustrated can be made without departing from the spirit of the disclosure. As can be recognized, certain embodiments of the inventions described herein can be embodied within a form that does not provide all of the features and benefits set forth herein, as some features can be used or practiced separately from others. The scope of certain inventions disclosed herein is indicated by the appended claims rather than by the foregoing description. All changes which come within the meaning and range of equivalency of the claims are to be embraced within their scope.

What is claimed is:
1. A system comprising:
   a first device in communication with a speaker, the first device configured to:
      obtain a digital signal;

insert a first sinusoidal waveform at a first frequency into the digital audio signal during an interval of time to generate an digital output signal;

convert the digital output signal to an analog output signal using a first oscillator operating at a first clock rate; and produce sound based on the analog output signal;

a second device in communication with a microphone, the second device configured to:

detect the produced sound as an analog input signal;

convert the analog input signal to a digital input signal using a second oscillator operating at a second clock rate;

obtain a spectral representation of the digital input signal;

determine a rotation based on the spectral representation at the first frequency;

determine a frequency offset based on the rotation that is indicative of a difference between the first clock rate and the second clock rate.

2. The system of claim 1, wherein the first sinusoidal waveform is configured to be inaudible to a listener.

3. The system of claim 1, wherein the first device is further configured to communicate to the second device the interval of time and the first frequency of the first sinusoidal waveform.

4. The system of claim 1, wherein:

the first device is further configured to insert a second sinusoidal waveform at a second frequency into the audio signal during the interval of time to generate the audio output signal; and the second device is further configured to:

determine a first angle of the spectral representation at the first frequency of the first inserted waveform;

determine a second angle of the spectral representation at the second frequency of the second inserted waveform; and determine a propagation delay between the audio input signal and the audio output signal based on a difference between the first and second angles.

5. The system of claim 1, wherein the second device is further configured to determine a number of samples to add or drop from the digital input signal based on the determined frequency offset.

6. The system of claim 5, wherein the second device is further configured to modify the digital input signal and perform acoustic echo cancellation using the modified digital input signal.

7. A method comprising:

receiving sound as an analog input signal, wherein the sound was generated by a sending device, wherein the sending device:

generated the sound using an analog output signal;

created the analog output signal from a digital output signal using a first clock rate; and inserted a first waveform into the digital output signal;

converting the analog input signal to a digital input signal using a second clock rate;

obtaining a spectral representation of the digital input signal;

determining a rotation based on the spectral representation at a frequency characteristic of the first inserted waveform; and determining a frequency offset based on the rotation that is indicative of a difference between the first clock rate and the second clock rate.

8. The method of claim 7, wherein the first inserted waveform comprises a sinusoid, and the frequency characteristic comprises a single frequency.

9. The method of claim 7, wherein the first inserted waveform is configured to be inaudible to a listener.

10. The method of claim 7, further comprising obtaining the frequency characteristic of the first inserted waveform.

11. The method of claim 7, wherein the sending device inserted a second waveform into the digital output signal, further comprising:

determining a first angle of the spectral representation at the frequency characteristic of the first inserted waveform;

determining a second angle of the spectral representation at a frequency characteristic of the second inserted waveform; and determining a propagation delay between the audio input signal and the audio output signal based on a difference between the first and second angles.

12. The method of claim 7, further comprising adding or dropping samples from the audio input signal based on the determined frequency offset.

13. The method of claim 12, further comprising modifying the digital input signal and performing acoustic echo cancellation using the modified digital input signal.

14. One or more non-transitory computer-readable storage media comprising computer-executable instructions to:

receive sound as an analog input signal, wherein the sound was generated by a sending device, wherein the sending device:

generated the sound using an analog output signal;

created the analog output signal from a digital output signal using a first clock rate; and inserted a first waveform into the digital output signal;

convert the analog input signal to a digital input signal using a second clock rate;

obtain a spectral representation of the digital input signal;

determine a rotation based on the spectral representation at a frequency characteristic of the first inserted waveform; and determine a frequency offset based on the rotation that is indicative of a difference between the first clock rate and the second clock rate.

15. The one or more non-transitory computer-readable storage media of claim 14, wherein the first inserted waveform comprises a sinusoid, and the frequency characteristic comprises a single frequency.

16. The one or more non-transitory computer-readable storage media of claim 14, wherein the first inserted waveform is configured to be inaudible to a listener.

17. The one or more non-transitory computer-readable storage media of claim 14, further comprising computer-executable instructions to obtain the frequency characteristic of the first inserted waveform.

18. The one or more non-transitory computer-readable storage media of claim 14, wherein the sending device inserted a second waveform into the digital output signal, further comprising computer-executable instructions to:

determine a first angle of the spectral representation at the frequency characteristic of the first inserted waveform;

determine a second angle of the spectral representation at a frequency characteristic of the second inserted waveform; and determine a propagation delay between the audio input signal and the audio output signal based on a difference between the first and second angles.

19. The one or more non-transitory computer-readable storage media of claim 14, further comprising computer-executable instructions to add or drop samples from the audio input signal based on the determined frequency offset.

20. The one or more non-transitory computer-readable storage media of claim 14, further comprising computer-executable instructions to modify the digital input signal and perform acoustic echo cancellation using the modified digital input signal.

* * * * *